(12) United States Patent
Ryu et al.

(10) Patent No.: US 8,626,470 B2
(45) Date of Patent: Jan. 7, 2014

(54) REVERSIBLE PERMEABILITY MEASURING DEVICE

(75) Inventors: Kwon Sang Ryu, Daejeon (KR); Soo Young Park, Daejeon (KR); Jong Seo Park, Daejeon (KR); In Hyun Cheong, Daejeon (KR); Kee-Bong Yoon, Yongin-si (KR)

(73) Assignees: Korea Research Institute of Standards and Science, Daejeon (KR); Chung-Ang University Industry Academy Cooperation Foundation, Seoul (KR)

( * ) Notice: Subject to any disclaimer, the term of this patent is extended or adjusted under 35 U.S.C. 154(b) by 312 days.

(21) Appl. No.: 13/001,896

(22) PCT Filed: Jul. 1, 2009

(86) PCT No.: PCT/KR2009/003573
§ 371 (c)(1),
(2), (4) Date: Dec. 29, 2010

(87) PCT Pub. No.: WO2010/002184
PCT Pub. Date: Jan. 7, 2010

(65) Prior Publication Data
US 2011/0112789 A1 May 12, 2011

(30) Foreign Application Priority Data

Jul. 2, 2008 (KR) ........................ 10-2008-0063810

(51) Int. Cl.
*G01R 33/12* (2006.01)
(52) U.S. Cl.
USPC ........................................................ 702/115
(58) Field of Classification Search
CPC ..................................................... G01R 31/343
USPC ........................................................ 702/115
IPC ..................................................... G01R 31/343
See application file for complete search history.

(56) References Cited

U.S. PATENT DOCUMENTS 4,931,730 A 6/1990 Olsen et al.

FOREIGN PATENT DOCUMENTS

| JP | 4233483 A | 8/1992 |
| JP | 6308092 A | 11/1994 |
| WO | 2007029539 A1 | 3/2007 |

OTHER PUBLICATIONS

Shaw, E.J., Design and Behaviour of Magnetic Potentiometers, Apr. 20, 1928, The Electrical Review, vol. 102, p. 678-680.*
Steingroever, E. "Some measurements of inhomogeneous permanent magnets by pole-coil method," Mar. 1, 1966, Journal of Applied Physics, V37(3).*
Ryu, K.S. et al., Nondestructive evaluation of aged 1Cr—1Mo—0.25V steel by harmonic analysis of induced voltage, 2001, Journal of Magnetism and Magnetic Materials, 231, p. 294-298.*
Ryu et al., "Nondestructive evaluation of aged 1Cr—1Mo—0.25 V steel by harmonic analysis of induced voltage," Journal of Magnetism and Magnetic Materials, 2001, pp. 294-298, vol. 231.

* cited by examiner

*Primary Examiner* — Jonathan C Teixeira Moffat
*Assistant Examiner* — Joseph J Yamamoto
(74) *Attorney, Agent, or Firm* — The Webb Law Firm

(57) ABSTRACT

The present invention relates to a reversible permeability measuring device for measuring magnetic characteristics and magnetic flux change in a specimen, as one of a plurality of non-destructive methods for evaluating mechanical properties. The reversible permeability measuring device of the present invention directly measures a magnetic field change induced at the surface of the specimen through the use of a magnetic potentiometer and a flux meter, thereby accurately evaluating the deterioration of materials.

2 Claims, 4 Drawing Sheets

[Prior Art]

REVERSIBLE PERMEABILITY MEASURING DEVICE

TECHNICAL FIELD

The present invention relates to a reversible permeability measuring device, and more particularly, to a reversible permeability measuring device for measuring magnetic characteristics and magnetic flux change in a specimen, as one of a plurality of non-destructive methods for evaluating mechanical properties.

BACKGROUND ART

Since mechanical properties of structural steel, turbine rotor steel, or the like, are associated with magnetic characteristics, the mechanical properties are evaluated by non-destructively measuring magnetic characteristics.

A coil used for a magnetic characteristic measuring device for measuring the magnetic characteristics is largely classified into a surface type probe measuring the change in a magnetic flux generated from a specimen by vertically disposing a coil on a surface of a specimen to be measured and an encircling type probe winding a coil around a round bar or a flake type specimen. The former is used to measure Barkhausen noise (BN) or harmonics and the latter is used to measure a magnetic hysteresis curve in addition to the BN or the harmonics. Among others, the former is usefully used for the magnetic evaluation of a non-destructively operated material.

An example of the reversible permeability measuring device was disclosed in paper "Nondestructive evaluation of aged 1Cr-1Mo-0.25V steel by harmonic analysis of induced voltage" (JMMM, Volume 231, 2001. 3) published in Journal of Magnetism and Magnetic Materials by the inventors.

The paper defines the correlation capable of measuring Vickers hardness, yield strength, and tensile strength, all of which are mechanical properties of artificially deteriorated 1Cr-1Mo-0.225V steel, non-destructively measuring reversible permeability that is a primary harmonic of an AC magnetic field with the surface type probe, and inferring mechanical properties with a coercive force that is ½ of a peak interval of reversible magnetic permeability.

A system of measuring reversible permeability with the surface type probe used in the paper was shown in FIG. 1.

The surface type probe is manufactured by winding a pick up coil to a yoke and then, winding an AC driving coil and a DC driving coil thereto. Meanwhile, a direct current is applied by power-amplifying a function generated from an I/O acquisition board with a power amplifier and an AC magnetic field applies a function generated from a function generator. The reversible permeability induced to the pick up coil is measured by a lock-in amplifier using a frequency of the AC magnetic field as a reference signal and values read by a shunt and the lock-in amplifier are measured through an input side of the I/O acquisition board and are then processed as data in a computer.

The magnetic characteristic measuring device having the above-mentioned structure uses a manner that obtains current from the voltage measured in the shunt to indirectly calculate a magnetic field H through the following Equation 1.

$$H = \frac{ni}{l} \quad \text{Equation 1}$$

(n: winding number per unit length, i: current obtained in shunt, and l: average magnetic path)

As represented by Equation 1, when the magnetic field H is calculated, it is calculated by an indirect calculation scheme, such that the measured value of the reversible permeability is inaccurate and the reliability of deterioration evaluation on materials is degraded.

The correlation capable of inferring the mechanical properties with a coercive force that is ½ of a peak interval of reversible magnetic permeability (PIRMP) using the magnetic characteristic measuring device having the above-mentioned structure is obtained, as shown in FIG. 2.

In this case, the measurement of the coercive force that is ½ of the peak interval of reversible magnetic permeability (PIRMP) is made as shown in a graph of FIG. 2. However, the graph shows result values that do not form a symmetry, such that the mechanical properties cannot be inferred accurately.

DISCLOSURE

Technical Problem

An object of the present invention is to provide a reversible permeability measuring device capable of more accurately evaluating deterioration of a material by directly measuring magnetic field on a surface of a specimen.

Technical Solution

In one general aspect, a reversible permeability measuring device includes: a surface type probe 10 including a DC driving coil 11 for applying a DC magnetic field, an AC driving coil 12 wound to an inner side of the DC driving coil 11 for applying AC perturbing magnetic field to the applied DC magnetic field, a pick up coil 13 wound to an inner side of the AC driving coil 12 for picking up an induced AC perturbing magnetic field, and a yoke 14 wound with the coils 11, 12, and 13 and spacing a specimen 1 from the coils 11, 12, and 13; a magnetic potentiometer 20 provided in an inner side of the surface type probe 10 for detecting magnetic field induced from a surface of the specimen 1, wherein the magnetic potentiometer is spaced from the yoke and is disposed on only one side of the specimen; an AC function generator 30 for applying an AC magnetic field function to the AC driving coil 12; a lock-in amplifier 40 for measuring reversible permeability induced in the pick up coil 13 by using the frequency of the applied AC perturbing magnetic field as a reference signal; a fluxmeter 50 for measuring a magnetic field induced from the surface of the specimen 1, which is detected from the magnetic potentiometer 20; an I/O acquisition board 60 for applying a DC magnetic field function to the DC driving coil 11, applying the AC magnetic field to the AC driving coil 12, and being supplied with the magnetic field induced from the surface of the specimen measured in the fluxmeter 50; a power amplifier 70 for applying power in a function applied from the I/O acquisition board 60 to the DC driving coil 11; and a microcomputer 80 for directly calculating the reversible permeability induced in the pick up coil 13 input to the I/O acquisition board 60 and the magnetic field generated from the surface of the specimen 1 measured in the fluxmeter 50, to measure a coercive force that is one-half of a peak interval of reversible magnetic permeability (PIRMP) to infer mechanical properties of the specimen.

The magnetic potentiometer 20 may be provided in the inner side of the yoke 14.

Advantageous Effects

The present invention improves the problem in that the measured value of the magnetic field is inaccurate and the reliability of deterioration evaluation on materials is degraded, due to the magnetic field H calculated by the indirect calculation manner. That is, the present invention directly measures the magnetic field generated on the surface of the specimen by using the magnetic potentiometer and the fluxmeter, thereby making it possible to more accurately evaluate the deterioration of the material.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

1: SPECIMEN 10: SURFACE TYPE PROBE
11: DC DRIVING COIL 12: AC DRIVING COIL
13: PICK UP COIL 14: YOKE
20: MAGNETIC POTENTIOMETER 30: AC WAVEFORM GENERATOR
40: LOCK-IN AMPLIFIER 50: FLUXMETER
60: I/O ACQUISITION BOARD 70: POWER AMPLIFIER
80: MICROCOMPUTER.

BEST MODE

Hereinafter, a reversible permeability measuring device according to the present invention will be described with reference to the accompanying drawings.

Figure 1:
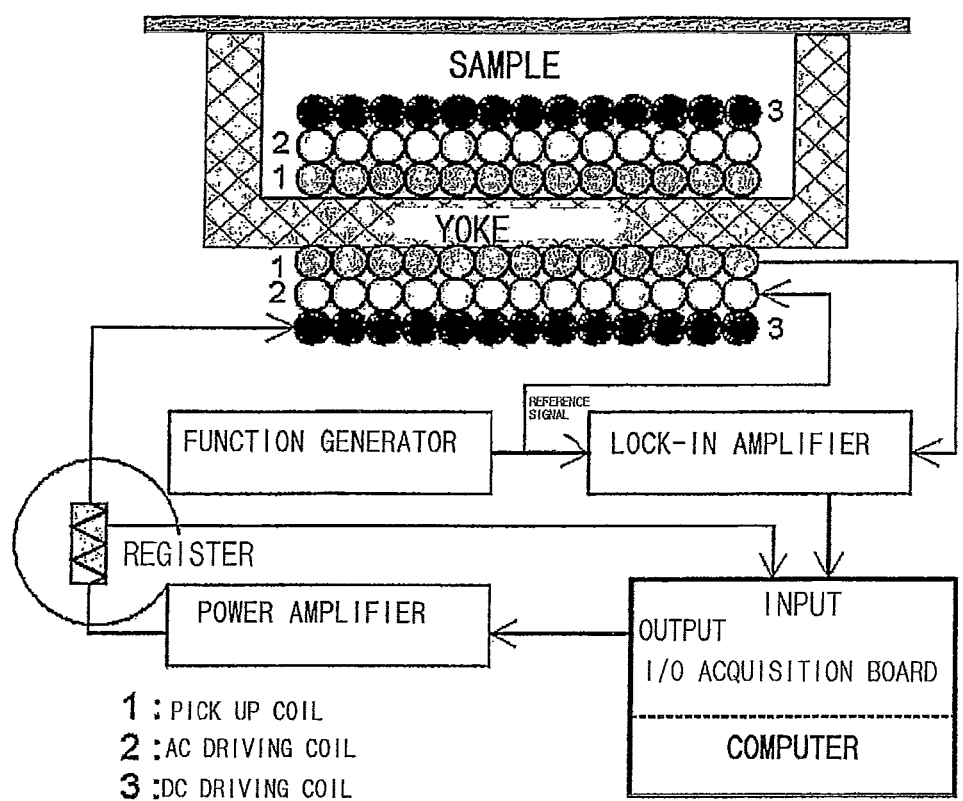
FIG. 1 is a diagram showing a reversible permeability measuring device according to the related art.
Figure 2:
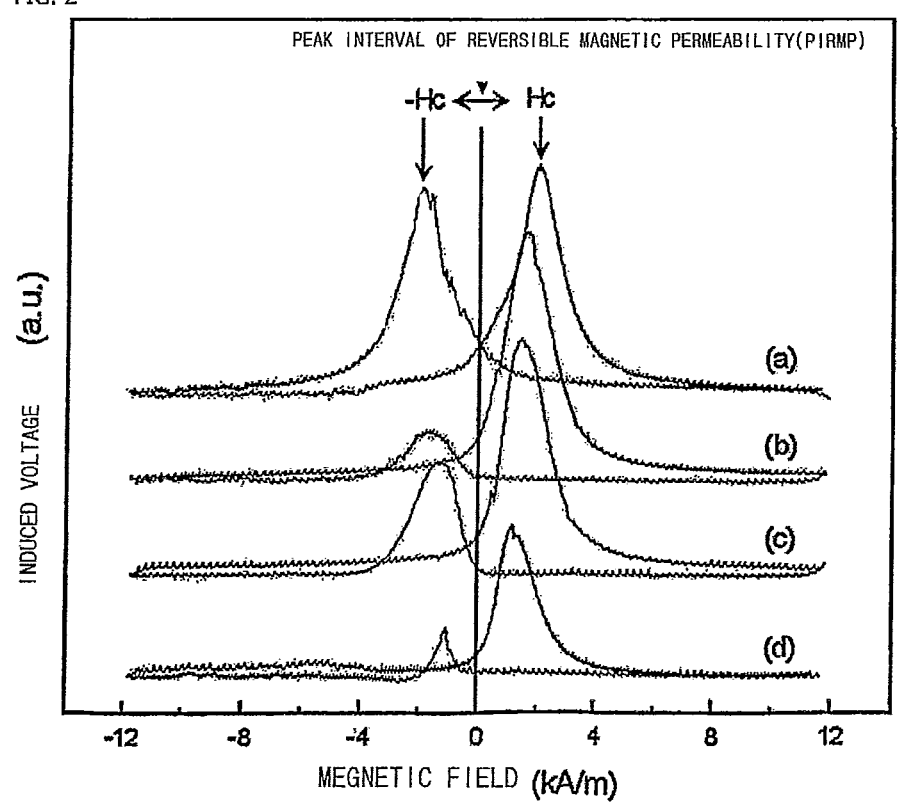
FIG. 2 is a graph measuring reversible permeability using the reversible permeability measuring device according to the related art.
Figure 3:
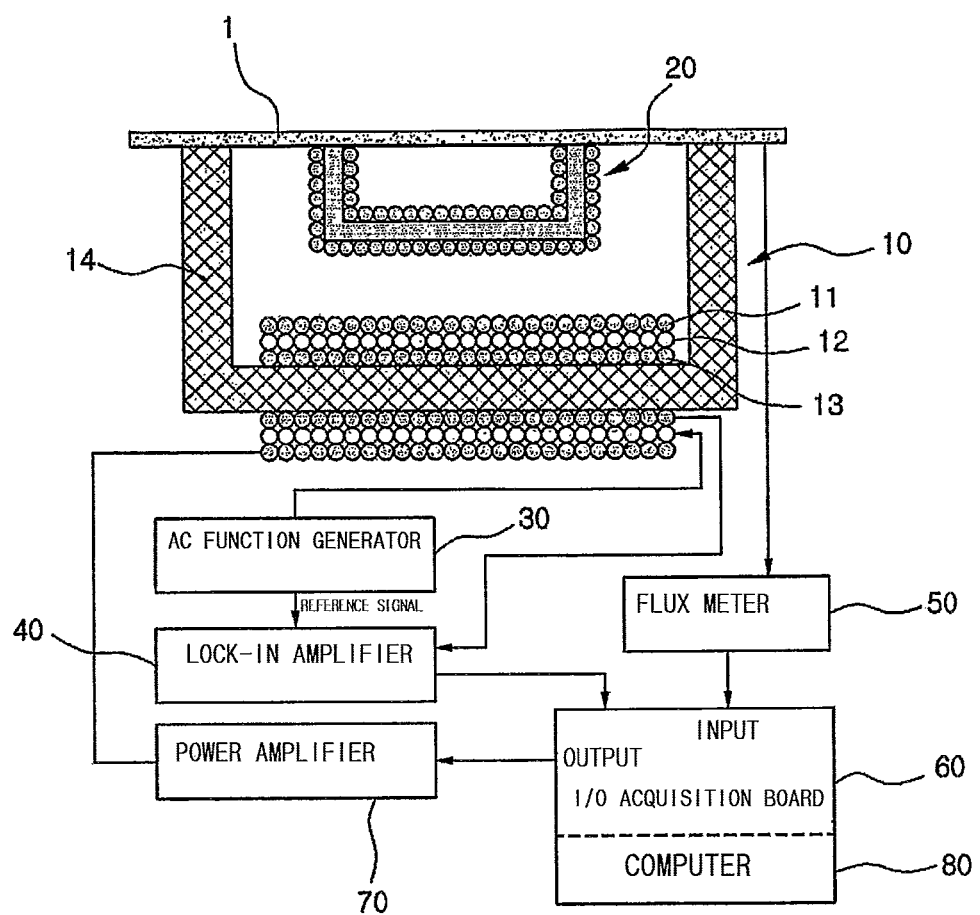
FIG. 3 is a diagram showing a reversible permeability measuring device according to the present invention.
Figure 4:
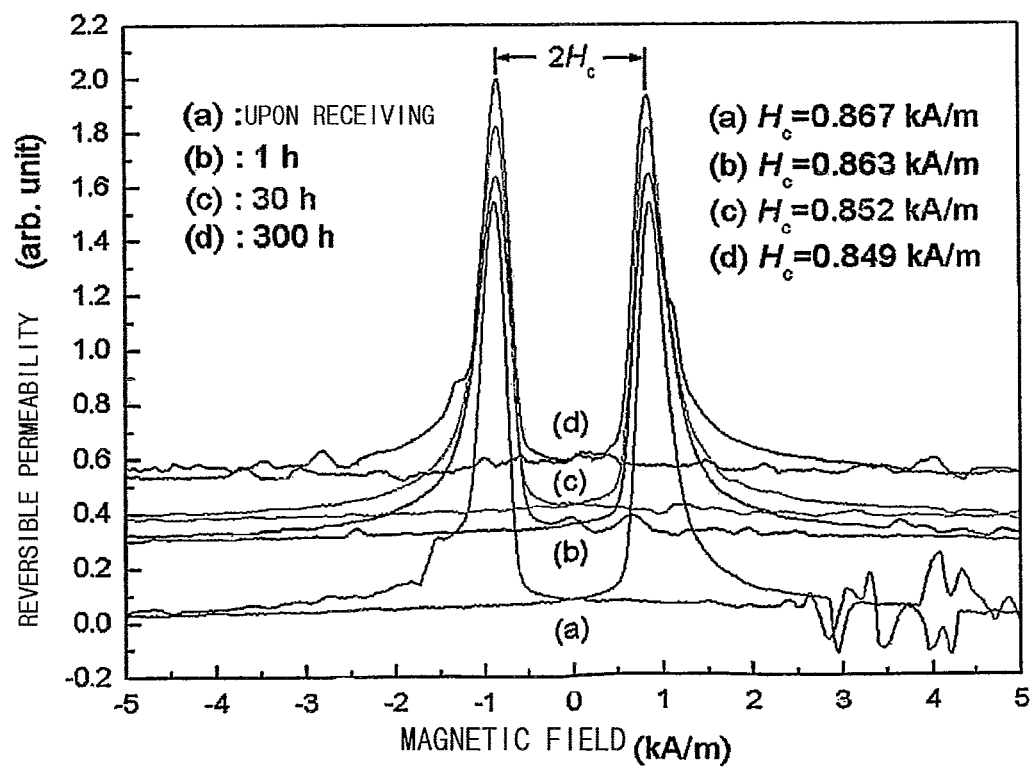
FIG. 4 is a graph measuring reversible permeability using the reversible permeability measuring device according to the present invention.

FIG. 3 is a diagram showing a reversible permeability measuring device according to the present invention and FIG. 4 is a graph measuring the reversible permeability using the reversible permeability measuring device according to the present invention.

As shown, the reversible permeability measuring device according to the present invention is configured to include a surface type probe 10 including a DC driving coil 11, an AC driving coil 12, a pick up coil 13, and a yoke 14 wound with the coils 11, 12, and 13; a magnetic potentiometer 20 detecting magnetic field induced from the surface of the specimen 1; an AC function generator 30 applying an AC magnetic field function to the AC driving coil 12; a lock-in amplifier 40 measuring reversible permeability of a specimen induced to the AC driving coil 12; a fluxmeter 50 measuring the magnetic field induced from the surface of the specimen 1; an I/O acquisition board 60 applying the reversible permeability of the specimen induced to the AC driving coil 12 and being applied with the magnetic field induced from the surface of the specimen 1 measured in the fluxmeter 50; a power amplifier 70 applying power to the DC driving coil 11; and a microcomputer 80 directly calculating the reversible permeability of the specimen induced to the pick up coil 13 and the magnetic field induced from the surface of the specimen 1 measured in the fluxmeter 50.

The surface type probe 10 is configured to include the DC driving coil 11, the AC driving coil 12, the pick up coil 13, and the yoke 14 wound with the coils 11, 12, and 13, wherein the pick up coil 13, the AC driving coil 12, and the DC driving coil 11 are sequentially wound from the inner side of the yoke 14.

The DC driving coil 11 is wound to the outermost side of the yoke 14 and applies the DC magnetic field. In this case, the applied DC magnetic field is applied through the power amplifier 70 in the DC magnetic field function applied from the I/O acquisition board.

The AC driving coil 12 is wound to the inner side of the DC driving coil 11 and serves to induce the AC perturbing magnetic field to the applied DC magnetic field.

The pick up coil 13 is wound to the inner side of the AC driving coil 12 and detects the DC magnetic field and the reversible permeability of the specimen induced by the AC perturbing magnetic field by the lock-in amplifier 40 using the frequency of the AC perturbing magnetic field as the reference signal.

The yoke 14 is wound with the coils 11, 12, and 13 and spaces the specimen 1 from the coils 11, 12, and 13.

The magnetic potentiometer 20 is provided in the inner side of the surface type probe 10 and serves to detect the magnetic field induced from the surface of the specimen 1. In this case, the magnetic potentiometer 20 may be provided in the inner side of the yoke 14.

The function generator 30 serves to apply the AC magnetic field function to the AC driving coil 12. The DC magnetic field applied from the DC driving coil 11 applies the AC magnetic field from the AC function generator 30 to induce the AC perturbing magnetic field.

The lock-in amplifier serves to measure the reversible permeability of the specimen induced to the pick up coil 13 using the frequency of the AC magnetic field function as the reference signal.

The fluxmeter 50 serves to directly measure the magnetic field induced from the surface of the specimen 1 detected from the magnetic potentiometer 20. Therefore, when the magnetic field H generated from the surface of the specimen is calculated, the related art calculates the magnetic field generated from the surface of the specimen through the indirect calculation manner rather than through the direct calculation manner, while the present invention directly measures the magnetic field generated from the surface of the specimen, thereby making it possible to obtain the accurate measured values and improve the reliability of deterioration evaluation on materials.

The I/O acquisition board 60 applies the DC magnetic field function to the DC driving coil 11 and applies the reversible permeability induced to the pick up coil 13 and the reversible permeability induced from the surface of the specimen 1 measured in the fluxmeter 50.

The power amplifier 70 serves to apply power in the function applied from the I/O acquisition board 60 to the DC driving coil 11.

The microcomputer 80 directly calculates the reversible permeability induced to the pick up coil 13, which is input to the I/O acquisition board 60, and the magnetic field induced from the surface of the specimen 1 measured in the fluxmeter 50.

FIG. 4 is a graph measuring the reversible permeability using the reversible permeability measuring device according to the present invention, wherein the reversible permeability of the specimen is measured according to the change in DC magnetic field.

As shown, it can be appreciated that the graph has result values of the left and right symmetrical structure. As such, as the graph has the left and right symmetrical structure, the coercive force that is ½ of the peak interval of reversible magnetic permeability (PIRMP) can be more accurately measured and the mechanical properties can be more accurately inferred.

INDUSTRIAL APPLICABILITY

The present invention improves the problem in that the measured value of the magnetic field is inaccurate and the reliability of deterioration evaluation on materials is degraded, due to the magnetic field H calculated by the indirect calculation manner. That is, the present invention directly measures the magnetic field generated on the surface of the specimen by using the magnetic potentiometer and the fluxmeter, thereby making it possible to more accurately evaluate the deterioration of the material.

The invention claimed is:

1. A reversible permeability measuring device, comprising:
    a surface type probe including:
    a DC driving coil for applying a DC magnetic field,
    an AC driving coil wound to an inner side of the DC driving coil for applying AC perturbing magnetic field to the applied DC magnetic field,
    a pick up coil wound to an inner side of the AC driving coil for picking up an induced AC perturbing magnetic field, and
    a yoke wound with the coils and spacing a specimen from the coils;
    a magnetic potentiometer provided in an inner side of the surface type probe for detecting magnetic field induced from a surface of the specimen, wherein the magnetic potentiometer is spaced from the yoke and is disposed on only one side of the specimen;
    an AC function generator for applying an AC magnetic field function to the AC driving coil;
    a lock-in amplifier for measuring reversible permeability induced in the pick up coil by using the frequency of the applied AC perturbing magnetic field as a reference signal;
    a fluxmeter for measuring a magnetic field induced from the surface of the specimen, which is detected from the magnetic potentiometer;
    an I/O acquisition board for applying a DC magnetic field function to the DC driving coil, applying the AC magnetic field to the AC driving coil, and being supplied with the magnetic field induced from the surface of the specimen measured in the fluxmeter;
    a power amplifier for applying power in a function applied from the I/O acquisition board 60 to the DC driving coil; and
    a microcomputer for directly calculating the reversible permeability induced in the pick up coil input to the I/O acquisition board and the magnetic field generated from the surface of the specimen measured in the fluxmeter.

2. The reversible permeability measuring device of claim 1, wherein the magnetic potentiometer is provided in the inner side of the yoke.

* * * * *